United States Patent
Kobayashi

(10) Patent No.: US 8,406,046 B2
(45) Date of Patent: Mar. 26, 2013

(54) DOMAIN-WALL MOTION TYPE MAGNETIC RANDOM ACCESS MEMORY WITH INCLINED REGIONS AND INITIALIZING METHOD

(75) Inventor: Yosuke Kobayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 100 days.

(21) Appl. No.: 13/112,700

(22) Filed: May 20, 2011

(65) Prior Publication Data

US 2011/0286264 A1    Nov. 24, 2011

(30) Foreign Application Priority Data

May 21, 2010  (JP) ................................. 2010-117534

(51) Int. Cl.
*G11C 11/15* (2006.01)
(52) U.S. Cl. .......................... 365/173; 365/145; 365/148
(58) Field of Classification Search .................. 365/173, 365/171, 145, 148, 163
See application file for complete search history.

(56) References Cited

U.S. PATENT DOCUMENTS

2012/0211811 A1* 8/2012 Nagahara et al. ............. 257/295

FOREIGN PATENT DOCUMENTS

JP    2009-99625 A    5/2009

* cited by examiner

*Primary Examiner* — Andrew Q Tran
(74) *Attorney, Agent, or Firm* — Sughrue Mion, PLLC

(57) ABSTRACT

A magnetic random access memory which includes a magnetic record layer which is ferromagnetic; a ferromagnetic magnetization fixed layer whose magnetization is fixed; and a non-magnetic spacer layer provided between the magnetic record layer and the magnetization fixed layer. The magnetic record layer includes a magnetization invertible region whose magnetization is invertible and which is connected to the magnetization fixed layer through the spacer layer; a first magnetization region which has a magnetization in a first direction and which is provided in parallel to the magnetization invertible region; a second magnetization region which has a magnetization in a second direction and which is provided in parallel to the magnetization invertible region; a first inclined region connected to the magnetization invertible region and the first magnetization region at a predetermined inclination angle; and a second inclined region connected to the magnetization invertible region and the second magnetization region at the inclination angle.

10 Claims, 13 Drawing Sheets

US 8,406,046 B2

DOMAIN-WALL MOTION TYPE MAGNETIC RANDOM ACCESS MEMORY WITH INCLINED REGIONS AND INITIALIZING METHOD

CROSS REFERENCE TO RELATED APPLICATION

The present application claims a priority on convention based on Japanese Patent Application No. 2010-117534. The disclosure thereof is incorporated herein by reference

BACKGROUND

The present invention relates to a magnetic random access memory and an initializing method thereof, and more particularly to a domain wall motion-type magnetic random access memory and an initializing method thereof.

A magnetic random access memory (MRAM) of a domain wall motion-type memory cells is known as a type of MRAM. For example, such an MRAM of the domain wall motion-type memory cells is disclosed in Japanese Patent Publication JP 2009-99625A. FIG. 1A is a diagram schematically showing a structure of the domain wall motion type memory cell in JP 2009-99625A. The memory cell 101 of the domain wall motion type is provided with a magnetic record layer (to be also referred to as a free layer) 110, a tunnel barrier layer 120, a pin layer 130, wirings 201, 202, and 203. The magnetic record layer 110 is a ferromagnetic layer which has a perpendicular magnetic anisotropy. The pin layer 130 is a ferromagnetic layer whose magnetization is fixed. The tunnel barrier layer 120 is a non-magnetic layer provided between the magnetic record layer 110 and the pin layer 130. The magnetic record layer 110 is composed of a magnetization invertible region 113 which has an invertible magnetization and which is connected to the pin layer 130 through the tunnel barrier layer 120, a the first magnetization fixed region 111a which is connected with the magnetization invertible region 113 in a first boundary and whose magnetization has a fixed direction, and a the second magnetization fixed region 111b which is connected with the magnetization invertible region 113 in a second boundary and whose magnetization has a fixed direction. The magnetization invertible region 113, the tunnel barrier layer 120 and the pin layer 130 configure an MTJ (magnetic tunneling Junction). In the memory cell 101 of this domain wall motion type, the initialization is required in the drive. The initialization of the memory cell 101 is performed by introducing only one domain wall into the magnetic record layer 110.

Generally, there are two modes of inversion nucleation and domain wall motion in which the magnetization of the magnetic substance is inverted. In the mode of inversion nucleation, a nucleus having a magnetization in a second direction (second magnetic substance) is generated in a first magnetic substance having the magnetization in a first direction by applying a magnetic field in the second direction opposite to the first direction, and the magnetization of the first magnetic substance is inverted to the second direction through the growth of the nucleus. In the mode of domain wall motion, a domain wall which exists in a boundary between the first magnetic substance having the magnetization in the first direction and the second magnetic substance having the magnetization in the second direction moves in the first magnetic substance so that the magnetization of the first magnetic substance is inversed to the second direction, by applying a magnetic field is applied to the second direction. Here, the followings are defined as H is the applied magnetic field, Hn is a magnetic field when an inversion nucleus is generated (hereinafter, to be referred to as an inversion nucleation magnetic field), and Hd is a magnetic field when the domain wall motion occurs (hereinafter, to be referred to as a domain wall motion magnetic field). At that time, when the magnetization of the magnetic substance is inversed, the following conditions (1) or (2) must be satisfied:

condition (1): in a region, H>Hn is satisfied (magnetization inversion through inversion nucleation), and condition (2): in the region, H>Hd is satisfied and the region is contact with the domain wall (the magnetization inversion through the domain wall motion).

AS mentioning above, in order to initialize the domain wall motion type memory cell 101, only one the domain wall must be introduced into the magnetic record layer 110. For this purpose, the regions of the magnetic record layer 110 are sequentially subjected to magnetization inversion. At that time, the regions need to be separated into a region in which a magnetization inversion magnetic field is small so that the magnetization inversion is performed (the above (1) or (2) is satisfied) and a region in which the magnetization inversion magnetic field is large so that the magnetization inversion is not performed.

FIG. 1B shows sectional views of a magnetic record layer for a method of initializing an MRAM described in JP 2009-99625A.

First, a magnetic field (Hz1) is applied in a +Z direction so that the magnetization directions in regions of the magnetic record layer 110 are all directed to a same direction (Step 1). Next, a magnetic field Hz2 (<Hz1) in the −Z direction is applied to the magnetization invertible region 113 to satisfy Hz2>Hn (Step 2). At this time, because the magnetization invertible region 113 satisfies the condition (1), the inversion nucleus is formed in the magnetization invertible region 113. The magnetization of the magnetization invertible region 113 is inverted when the magnetic field in the −Z direction is increased (Hz3). Domain walls 112c and 112d are introduced between a first magnetization fixed region 111a and the magnetization invertible region 113 and between the magnetization invertible region 113 and a second magnetization fixed region 111b, respectively (Step 3). Since the first magnetization fixed region 111a satisfies the condition (2) when the magnetic field in the −Z direction is further increased (Hz4) so that Hz4>Hd is satisfied in the magnetization fixed region 111a, the magnetization of the first magnetization fixed region 111a is inverted (Step 4). If the applied magnetic field is returned to zero in this state, the anti-parallel initial state is realized in which only one the domain wall 112d is injected in the DW layer.

CITATION LIST

Patent Literature

[Patent Literature 1]: JP 2009-99625A

SUMMARY

In an initializing method of an MRAM disclosed in Japanese Patent Publication JP 2009-99625A, an important point lies in that the second magnetization fixed region 111b is never inverted.

Therefore, Hd of the second magnetization fixed region 111b should be large sufficiently compared with Hd of the first magnetization fixed region 111a. For this purpose, as shown in FIG. 2E, it could be considered that hard layers 140a and 140b (of magnetic substance having large inversion magnetic field) are joined with the first magnetization fixed region 111a and the second magnetization fixed region 111b. In this case, the magnetizations of the first magnetization fixed region 111a and the second magnetization fixed region 111b are fixed to the hard layers 140a and 140b. By changing a degree of the magnetization fixation of each of the regions, it is possible to make Hd of the second magnetization fixed region 111b large sufficiently, compared with Hd of the first magnetization fixed region 111a. Here, Hd of the second magnetization fixed region 111b is determined based on the strength of magnetic coupling between the second magnetization fixed region 111b and the hard layer 140b, and the strength of magnetic coupling is dominated based on a degree of joining of the second magnetization fixed region 111b and the hard layer 140b. Here, the hard layers 140a and 140b are exposed from a state embedded in an interlayer film by a CMP (Chemical Mechanical Polishing) method or through etching back by a dry etching method, and then connected with the magnetic record layer 110. In this case, it is found that a following problem is caused.

FIG. 2A to FIG. 2D are sectional views showing a process of exposing the surfaces of the hard layers embedded in an interlayer film. In each figure, the left side shows a central portion in a wafer plane and the right side shows a peripheral portion in the wafer plane. The process of exposing the surfaces of the hard layers embedded in the interlayer film (hereinafter, to be referred to as a surface exposing process) is as follows.

First, hard layers 140 are formed on the substrate (containing elements, interconnections and other interlayer films), as shown in FIG. 2A. Next, an interlayer film 160 is formed on the substrate surface which contains the hard layers 140, as shown in FIG. 2B. Next, the interlayer film 160 is flattened by a CMP process as shown in FIG. 2C. Moreover, the surfaces of the hard layers embedded in the interlayer film are exposed by the CMP process as shown in FIG. 2D (in the surface exposing process).

In this process, polishing quantities in the CMP process have a distribution of 10 nm in the wafer plane (FIG. 2C). A variation of the wafer plane in this CMP process is reflected on the variation of the polishing quantities of the hard layers 140 (FIG. 2D). For example, if the variation of the wafer plane in the CMP process is about 10 nm when the film thicknesses of the hard layers 140 are in an order of 20-30 nm, the film thicknesses of the hard layers 140 are in the variation of the wafer plane of about 30% to 50%. In this case, for example, the film thicknesses of the hard layers 140 are greatly different between the central portion of the wafer plane and the peripheral portion of the wafer surface as shown in FIG. 3A. As a result, the magnetic coupling of the magnetic record layer 110 and the hard layer 140 is greatly different between the central potion of the wafer surface and the peripheral portion of the wafer surface. If the film thicknesses of the hard layers 140 are made equal between the central portion and the peripheral portion in the wafer plane in order to prevent the above difference, an interlayer film is left between the hard layer 140 and the magnetic record layer 110 in the peripheral portion of the wafer plane, as shown in FIG. 3B. As a result, even in this case, the magnetic coupling of the magnetic record layer 110 and the hard layer 140 is greatly different between the central portion of the wafer surface and the peripheral portion of the wafer surface. Therefore, in any case of FIG. 3A and FIG. 3B, the characteristic of the hard layer 140 is varied in the wafer plane, and it is not possible to initialize uniformly in the wafer plane.

In this way, the surface exposing process of the hard layer 140 has a large variation in the wafer plane. As a result, Hd of the second magnetization fixed region 111b is largely varied. When Hd of the second magnetization fixed region 111b is largely varied, it is necessary to provide a margin between Hd of the second magnetization fixed region 111b and Hd of the first magnetization fixed region 111a so as to absorb the variation. However, there is a restriction on magnetism design to control these parameters.

A magnetic random access memory according to present invention, includes a magnetic record layer which is ferromagnetic, a ferromagnetic magnetization fixed layer having a magnetization fixed, and a spacer layer which is non-magnetic and which is provided between the magnetic record layer and the magnetization fixed layer. The magnetic record layer has an invertible magnetization, and includes a magnetization invertible region which is connected to the magnetization fixed layer through the spacer layer, a first magnetization region which having a magnetization in a first direction and is provided in parallel to the magnetization invertible region, and a second magnetization region which has a magnetization in a second direction and is provided in parallel to the magnetization invertible region, a first inclined region which are connected with the magnetization invertible region and the first magnetization region at a predetermined inclination angle, and a second inclined region connected with the magnetization invertible region and the second magnetization region at the inclination angle.

In such a magnetic random access memory, an initializing method is attained by setting magnetization directions of the magnetization invertible region, the first magnetization region, the second magnetization region, the first inclined region, and the second inclined region to a same direction; by applying a first magnetic field on a surface of the first inclined region at a first angle to invert the magnetization direction of the first inclined region; and by applying a second magnetic field in a direction parallel to a surface of the second inclined region to invert the magnetization directions of the first magnetization region and the magnetization invertible region.

According to the present invention, a free layer (magnetic record layer) can be initialized without being influenced by a variation of the hard layers in a plane in an MRAM.

BRIEF DESCRIPTION OF THE DRAWINGS

The above and other objects, advantages and features of the present invention will be more apparent from the following description of certain embodiments taken in conjunction with the accompanying drawings, in which.

DETAILED DESCRIPTION

Hereinafter, a magnetic random access memory (MRAM) and an initializing method of the present invention will be described below with reference to the attached drawings.

Figure 1A:
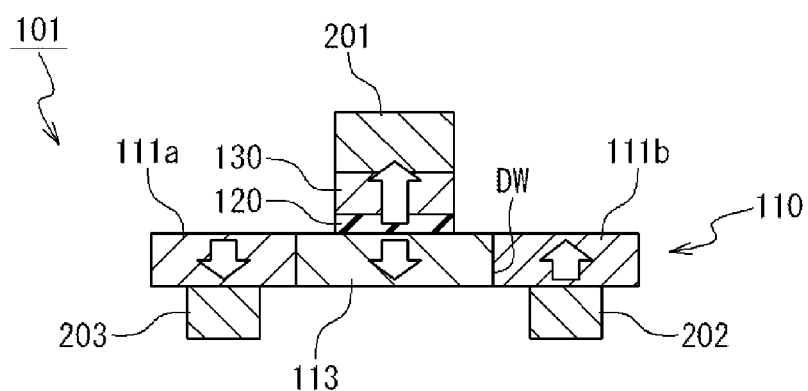
FIG. 1A is a diagram schematically showing the configuration of a domain wall motion-type memory cell disclosed in JP 2009-99625A.
Figure 1B:
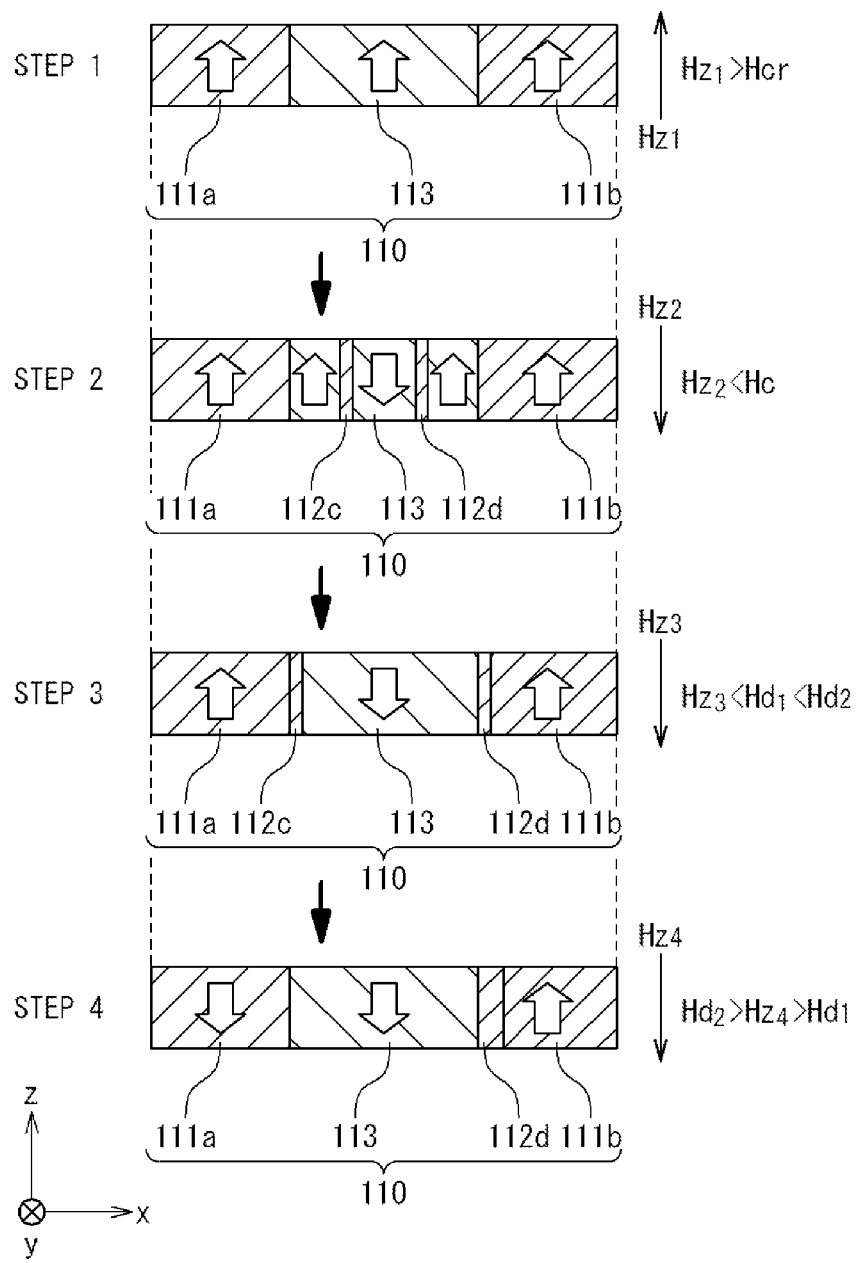
FIG. 1B is a sectional view showing a magnetic record layer in initialization of an MRAM disclosed in JP 2009-99625A.
Figure 2A:
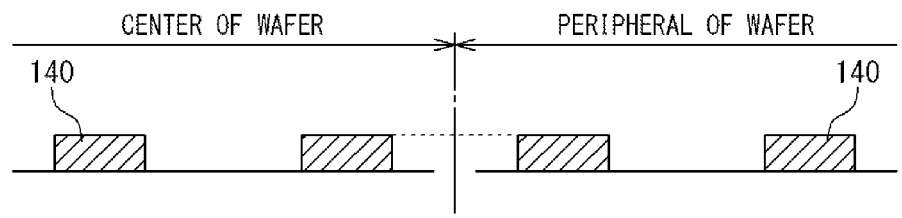
FIG. 2A is a sectional view showing a process of exposing the surface of a hard layer embedded in an interlayer film.
Figure 2B:
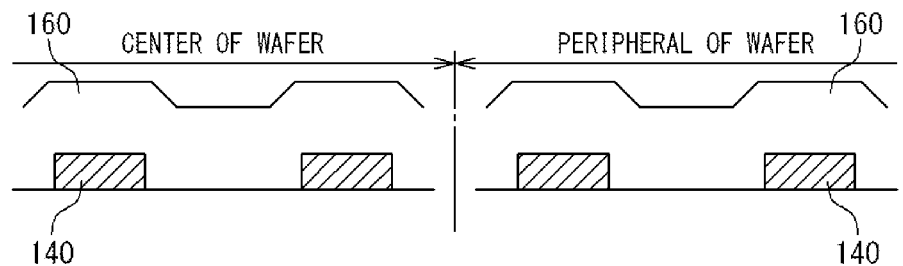
FIG. 2B is a sectional view showing the process of exposing the surface of the hard layer embedded in the interlayer film.
Figure 2C:
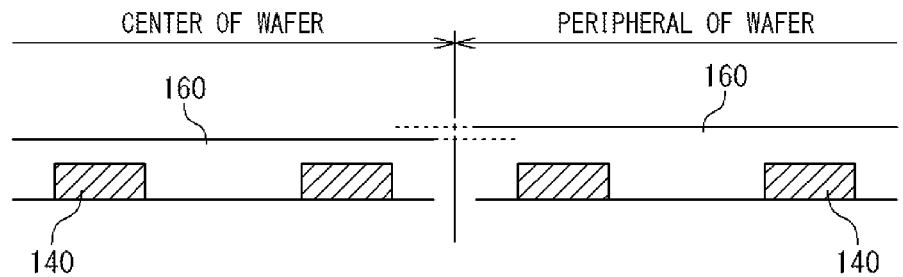
FIG. 2C is a sectional view showing the process of exposing the surface of the hard layer embedded in the interlayer film.
Figure 2D:
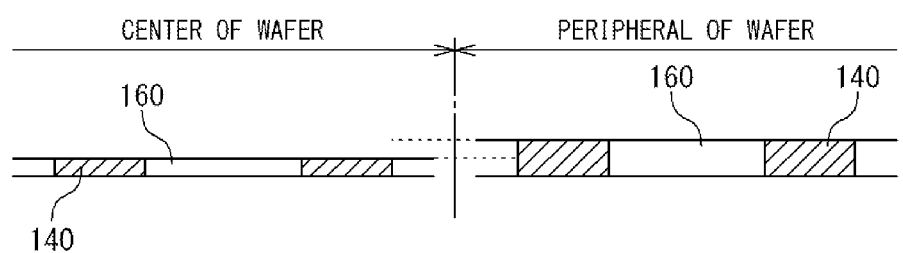
FIG. 2D is a sectional view showing the process of exposing the surface of the hard layer embedded in the interlayer film.
Figure 2E:
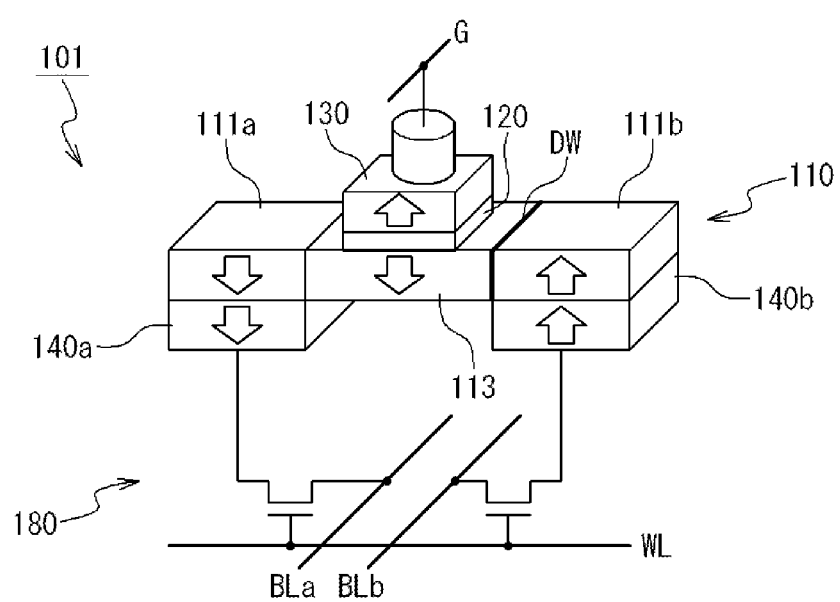
FIG. 2E is a diagram schematically showing the configuration of a domain wall motion-type memory cell in which the hard layer is provided in contact with to a first magnetization fixed region and a second magnetization fixed region.
Figure 3A:
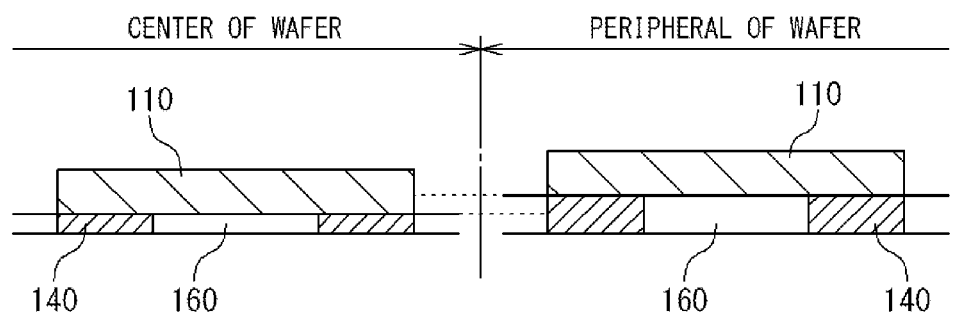
FIG. 3A is a sectional view showing a relation between the magnetic record layer and the hard layer embedded in the interlayer film.
Figure 3B:
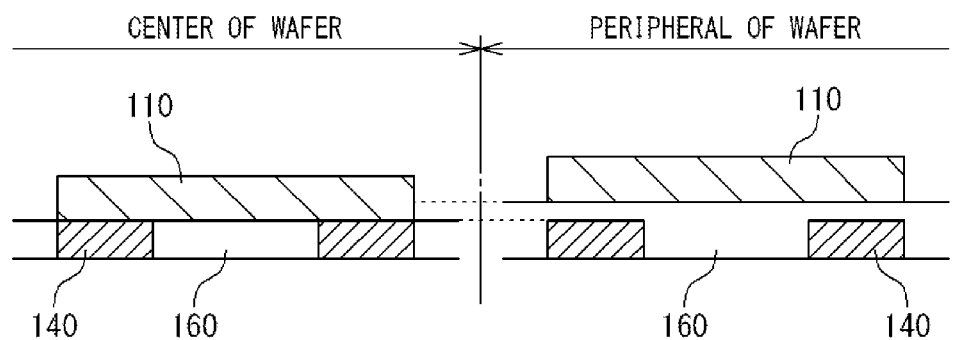
FIG. 3B is a sectional view showing a relation between the magnetic record layer and the hard layer embedded in the interlayer film.
Figure 4A:
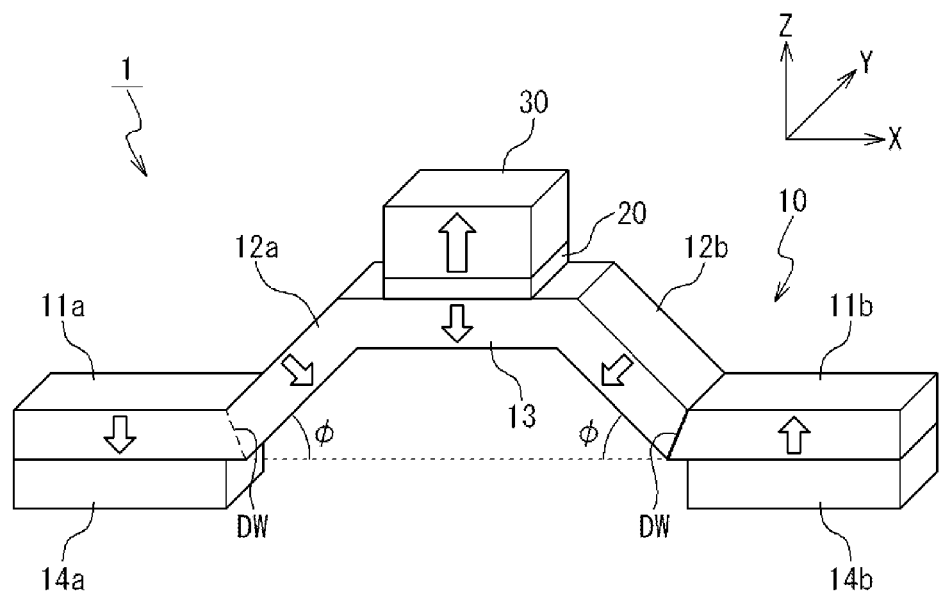
FIG. 4A is a perspective view showing the configuration of a magnetic resistance device of an MRAM according to an embodiment of the present invention.
Figure 4B:
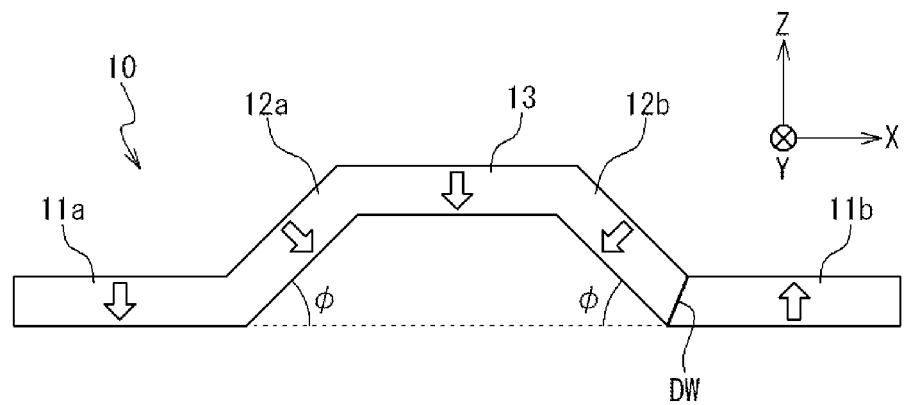
FIG. 4B is a sectional view showing the configuration of the magnetic resistance device of the MRAM according to the embodiment of the present invention.

First, the configuration of an MRAM according to an embodiment of the present invention will be described with reference to the attached drawings. FIG. 4A and FIG. 4B are a perspective view and a sectional view, which show the configuration of a magnetic resistance device of the MRAM according to the embodiment of the present invention. Here, FIG. 4B shows only a magnetic record layer 10 (to be described later) in FIG. 4A. An arrow in each region shows the direction of magnetization. The magnetic resistance device 1 is provided with the magnetic record layer 10, a spacer layer 20, a reference layer (magnetization fixed layer) 30, and hard layers 14a and 14b. Here, not the hard layers but current terminals 14a and 14b may be provided. The magnetic record layer 10 is a ferromagnetic layer which has perpendicular magnetic anisotropy. The reference layer 30 is a ferromagnetic layer in which magnetization direction is fixed. The spacer layer 20 is a non-magnetic layer provided between the magnetic record layer 10 and the reference layer 30. The hard layers 14a and 14b are formed of magnetic substances having large inversion magnetic fields, and are magnetically coupled with both ends (a first magnetization region 11a and a second magnetization region 11b, to be described later) of the magnetic record layer 10. They sometimes function as the current terminals of conductors.

The magnetic record layer 10 is provided with a magnetization invertible region 13, the first magnetization region 11a, the second magnetization region 11b, a first inclined region 12a and a second inclined region 12b. The magnetization invertible region 13 is invertible in magnetization and is connected to the reference layer 30 through the spacer layer 20. That is, the magnetization invertible region 13, the spacer layer 20 and the reference layer 30 configure an MTJ (magnetic tunneling Junction). The first magnetization region 11a has a magnetization fixed in a first direction and is provided in parallel to the magnetization invertible region 13. The second magnetization region 11b has a magnetization fixed in a second direction and is provided in parallel to the magnetization invertible region 13. The first direction and the second direction are anti-parallel, i.e. they are parallel to each other and opposite to each other in direction. The first inclined region 12a is coupled to the magnetization invertible region 13 and the first magnetization region 11a at a given inclination angle φ. The second inclined region 12b is coupled to the magnetization invertible region 13 and the second magnetization region 11b at the inclination angle φ. The detail of the inclination angle φ is described later.

The first magnetization region 11a, the first inclined region 12a, the magnetization invertible region 13, the second inclined region 12b and the second magnetization region 11b are coupled in an X direction (a direction parallel to the substrate surface) in this order. The first inclined region 12a, the magnetization invertible region 13 and the second inclined region 12b are formed to have a shape swelled in the +Z direction (an upwardly vertical direction to the substrate surface) (a convex shape) from the upper surfaces of the first magnetization region 11a and the second magnetization region 11b (the surface in the +Z direction). Here, it may have a shape swelled in the −Z direction (a downwardly vertical to the substrate surface) (a convex shape). The surface of the magnetization invertible region 13 is substantially parallel to the surfaces of the first magnetization region 11a and the second magnetization region 11b.

The magnetic record layer 10 has magnetic anisotropy in a direction perpendicular to the layer surface. As a material of the magnetic record layer 10, it is desirable to contain at least a material selected from the group consisting of iron (Fe), cobalt (Co), and nickel (Ni). Moreover, the perpendicular magnetic anisotropy can be stabilized when the magnetic record layer 10 contains platinum (Pt) or palladium (Pd). In addition, the magnetic record layer 10 can be controlled such that the desired magnetic property can be expressed, by adding B, C, N, O, Al, Si, P, Ti, V, Cr, Mn, Cu, Zn, Zr, Nb, Mo, a Tc, Ru, Rh, Ag, Hf, Ta, W, Re, Os, Ir, Au, and Sm to the material of the magnetic record layer 10. Specifically, the magnetic record layer 10 can be configured of any of Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, and Sm—Co. Besides, the magnetic record layer 10 can express the perpendicular magnetic anisotropy by laminating a layer containing at least one material selected from the group consisting of Fe, Co and Ni and a different layer. Specifically, the laminating body of Co/Pd, Co/Pt, and Fe/Au can be used for the magnetic record layer 10. It is desirable for the reference layer 30 to be formed of the same materials as the magnetic record layer 10 and to have perpendicular magnetic anisotropy. It is desirable that the hard layers 14a and 14b are formed of the same materials as the magnetic record layer 10, and have a large inversion magnetic field (large coercive force) and perpendicular magnetic anisotropy. The spacer layer 20 is formed from an insulator film such as an $Al_2O_3$ film and a MgO film. The spacer layer 20 is thin in film thickness to the extent that a tunnel current can flow. Materials expressing a large TMR effect such as CoFe and CoFeB may be used for a part of the magnetic record layer 10 and the reference layer 30, especially, a part contacting the spacer layer 20. Cu, Al, W, and so on may be used in a case of the current terminals 14a and 14b.

The magnetization of the first magnetization region 11a and the magnetization of the second magnetization region 11b are fixed in an anti-parallel direction to each other. In an example shown in FIG. 4A and FIG. 4B, the magnetization of the first magnetization region 11a is fixed to the −Z direction (downwardly vertical to the substrate surface) and the magnetization of magnetization fixed region 11b is fixed in the +Z direction (upwardly vertical to the substrate surface). It should be noted that the state in which "the magnetization is fixed" means that the magnetization direction does not change before and after a write operation. Even if the magnetization direction of a part of the magnetization fixed regions 11a and 11b changes during the write operation, the magnetization direction turns back after the write operation.

On the other hand, the magnetization direction of the magnetization invertible region 13 is invertible between the +Z direction and the −Z direction. In other words, the magnetization of the magnetization invertible region 13 turns to be parallel to or anti-parallel to the magnetization direction of the reference layer 30. When the magnetization direction of the magnetization invertible region 13 is the −Z direction as shown in FIG. 4A, the second inclined region 12b, the magnetization invertible region 13, the first inclined region 12a, and the first magnetization region 11a configure one magnetic domain, and the magnetization fixed region 11b configures another magnetic domain. In other words, the domain wall (DW) is formed in a boundary between the second inclined region 12b and the second magnetization region 11b. On the other hand, when the magnetization direction of the magnetization invertible region 13 is the +Z direction, the first magnetization region 11a configures one magnetic domain, and the first inclined region 12a, the magnetization invertible region 13, the second inclined region 12b and the second magnetization region 11b configure another magnetic domain. In other words, a domain wall DW is formed in a boundary between the first inclined region 12a and the first magnetization region 11a.

In a case of the write operation, the reason why the domain wall DW is retained on these positions is as follows.

When the current terminals 14a and 14b are used as current terminals without using the hard layers 14a and 14b, the write current flows into the current terminals 14a and 14b, so that a current density of the write current in the first magnetization region 11a and the second magnetization region 11b is reduced. For this reason, the domain wall becomes not able to move from those positions.

Figure 5A:
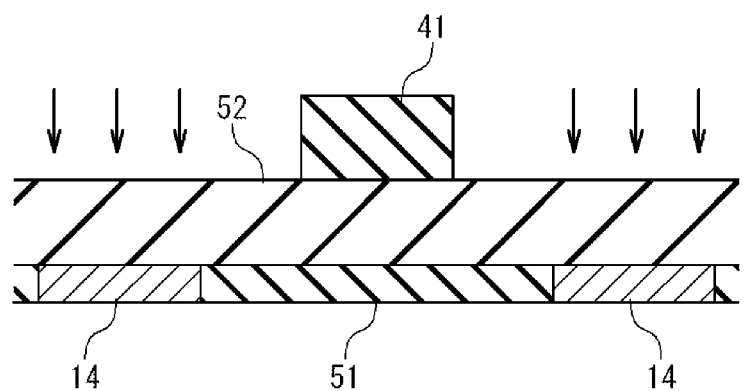
FIG. 5A is a sectional view showing a manufacturing method of the magnetic resistance device according to the embodiment.
Figure 5B:
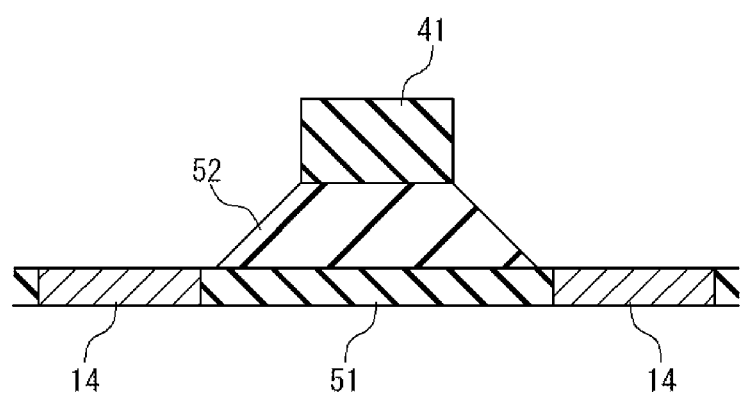
FIG. 5B is a sectional view showing the manufacturing method of the magnetic resistance device according to the embodiment.
Figure 5C:
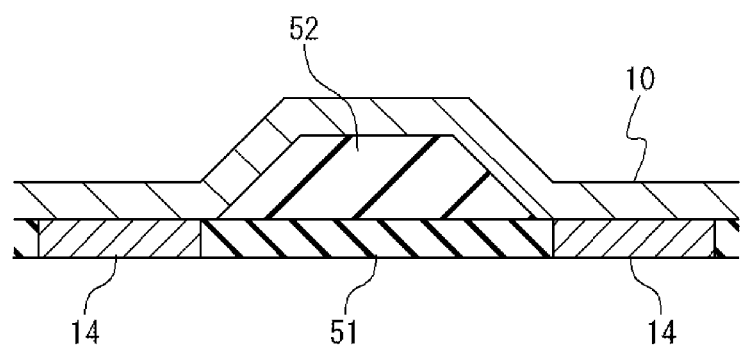
FIG. 5C is a sectional view showing the manufacturing method of the magnetic resistance device according to the embodiment.

Next, a manufacturing method of the magnetic resistance device according to the present embodiment will be described. FIG. 5A to FIG. 5C are sectional views showing the manufacturing method of the magnetic resistance device according to the present embodiment.

First, an interlayer film 51 and hard layers 14 embedded in the film 51 are formed on a substrate (containing elements, interconnections and other interlayer films), as shown in FIG. 5A. A surface of the hard layer 14 is exposed to the surface of the interlayer film 51. Next, the interlayer film 52 is formed to cover the substrate surface. After that, a resist pattern 41 is formed in a position for the magnetization invertible region 13 to be formed. Then, the interlayer film 52 is etched back by using the resist pattern 41 as a mask. By controlling the etch back condition, the interlayer film 52 can be formed to have a trapezoidal shape extending on the side of the substrate under the resist pattern 41, as shown in FIG. 5B. After that, the resist pattern 41 is removed and a film for the magnetic record layer 10 is formed to cover the whole surface of the substrate, as shown in FIG. 5C. After that, the magnetic resistance device 1 shown in FIG. 4A and FIG. 4B can be obtained in a process similar to a conventional process. For example, 2 layers of a film for the spacer layer 20, and a film for the reference layer 30 are formed on the film for the magnetic record layer 10. Next, the 3 layers are patterned to have the shape of the magnetic record layer 10. After that, the film for the reference layer 30 is patterned to have the shape of the reference layer 30. Thus, the magnetic resistance device 1 of FIG. 4A and FIG. 4B can be substantively obtained.

It should be noted that in order to restrain damage to the hard layer 14 and the interlayer film 51, the interlayer film 52 is left on the interlayer film 51 and the hard layer 14 to have a small thickness, in a case of the etch-back shown in the process of FIG. 5A. Next, the resist pattern 41 is peeled off and the left interlayer film 52 may be removed with RF sputtering of a weak RF power.

Next, the initializing method according to the present embodiment will be described.

Figure 6A:
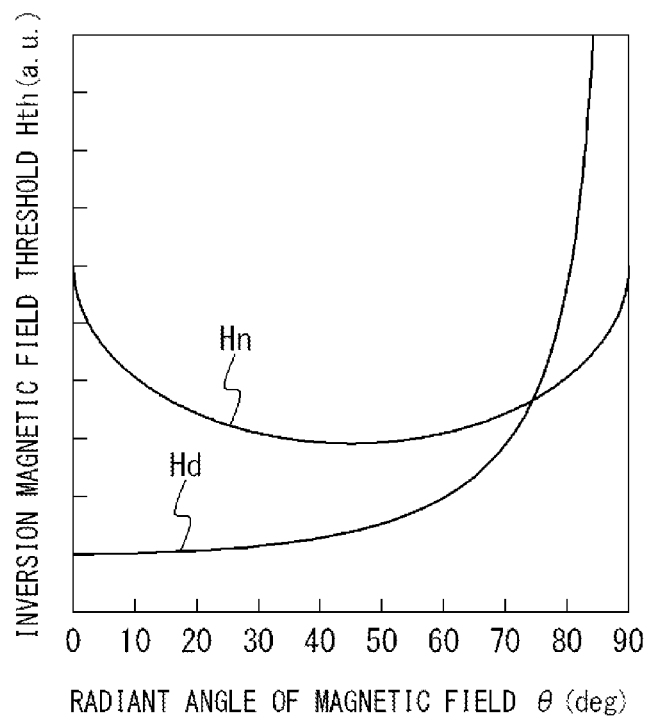
FIG. 6A is a graph showing the magnetic field inclination angle dependence of inversion nucleation magnetic field Hn and domain wall motion magnetic field Hd in a magnetic film.
Figure 6B:
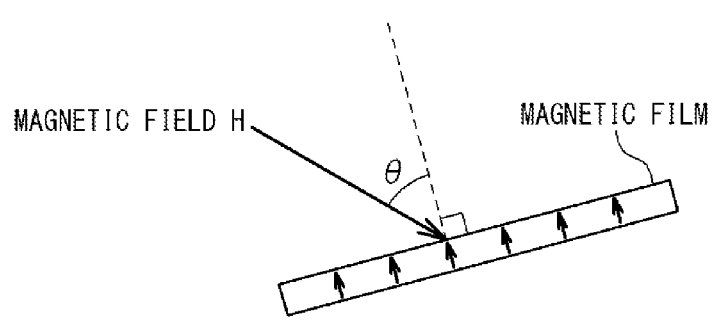
FIG. 6B is a graph showing a definition of an inclination angle θ of the magnetic field in FIG. 6A.

First, the magnetic field inclination angle dependence of inversion nucleation magnetic field Hn and domain wall motion magnetic field Hd in the magnetism film will be described. FIG. 6A is a graph showing the magnetic field inclination angle dependence of the inversion nucleation magnetic field Hn and the domain wall motion magnetic field Hd in the magnetism film. The vertical axis shows a relative value of the magnetic field threshold when the magnetization is inverted, i.e. the relative value of inversion nucleation magnetic field Hn and domain wall motion magnetic field Hd. The horizontal axis shows angle θ of the magnetic field. FIG. 6B is a graph showing a definition of angle θ of the magnetic field in FIG. 6A. The inclination angle θ of the magnetic field is defined as an angle of magnetic field H (incidence angle) to a direction C perpendicular to the surface of the magnetic film (the direction of magnetization is upwardly vertical to the surface).

As shown in FIG. 6A, the inversion nucleation magnetic field Hn has local maximum values around the angle θ=0° and 90°. Also, the inversion nucleation magnetic field Hn has a local minimum value near the angle θ=45°. On the other hand, the domain wall motion magnetic field Hd has a maximum value near the angle θ=90° and diverges (Hd=∞; domain walls does not move). The inversion nucleation magnetic field Hn and the domain wall motion magnetic field Hd intersect at the inclination angle θ=θ$_0$ (about 75°). That is, in θ=θ$_0$, the domain wall motion magnetic field Hd=the inversion nucleation magnetic field Hn. In θ<θ$_0$, (the domain wall motion magnetic field Hd<the inversion nucleation magnetic field Hn) is satisfied. In θ>θ$_0$, (the domain wall motion magnetic field Hd>the inversion nucleation magnetic field Hn) is satisfied. Therefore, if the magnetic field H is applied to a parallel direction to the magnetic film (near the inclination angle θ=90°), the magnetization is never inverted unless the magnetic field H which exceeds the inversion nucleation magnetic field Hn is applied. Also, when the magnetic field is applied to the magnetic film to satisfy a relation of Hn>H>Hd in the inclination angle θ range in which (the inversion nucleation magnetic field Hn>the domain wall motion magnetic field Hd) is satisfied, the magnetization inversion occurs due to the domain wall motion in a region which neighbors the domain wall but the magnetization inversion does not occur in the regions which does not neighbor the domain wall. The initializing method according to the present embodiment is implemented using these principles.

Next, the initializing method according to the present embodiment will be described in detail. FIG. 7A to FIG. 7E are sectional views showing the initializing method according to the embodiment of the present invention. FIG. 7A to FIG. 7E show only the magnetic record layer 10 in FIG. 4A.

Figure 7A:
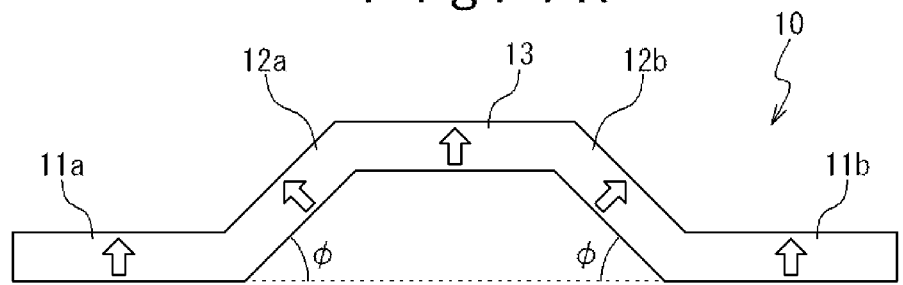
FIG. 7A is a sectional view showing the initializing method according to the embodiment of the present invention.

First, the description is started from the state that the magnetizations of the first magnetization region 11a, the first inclined region 12a, the magnetization invertible region 13, the second inclined region 12b and the second magnetization region 11b are directed to the upwardly vertical to the surface of the magnetic record layer (surface in the +Z direction), as shown in FIG. 7A. This state is attained by applying the magnetic field H0 which is sufficiently larger than the coercive force of the magnetic record layer 10 in the +Z direction, and then removing it.

Figure 7B:
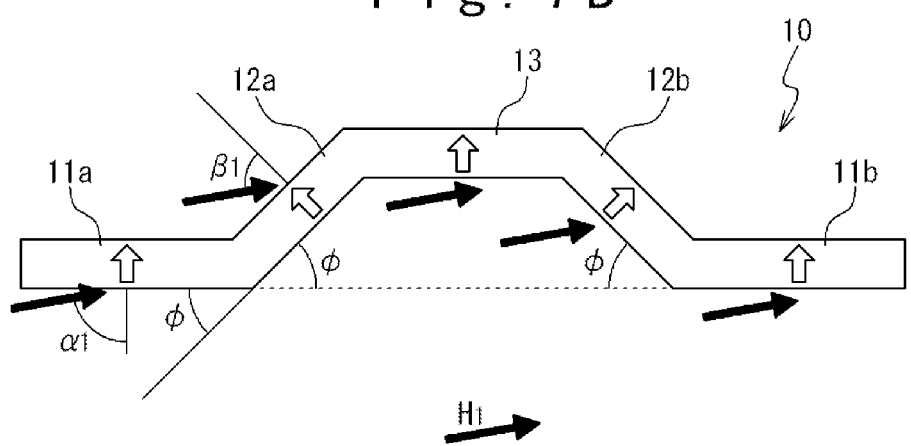
FIG. 7B is a sectional view showing the initializing method according to the embodiment of the present invention.

A magnetic field H1 is applied to the magnetic record layer 10 in the state shown in FIG. 7A from the underside of the magnetic record layer 10 (the surface in the -Z direction) at an inclination angle α1 to the underside of the first magnetization region 11a, the magnetization invertible region 13 and the second magnetization region 11b, as shown in FIG. 7B (magnetic field applying step 1). The inclination angle α1 is first selected such that the magnetic field H1 is applied from the side of the underside of the magnetic record layer 10, i.e. a rear side of the first magnetization region 11a, the magnetization invertible region 13, the second inclined region 12b and the second magnetization region with respect to the magnetization direction. That is, $$90°>α1 \quad (F1)$$

At this time, the inclination angle β1 to the first inclined region 12a must satisfy an angle range such that the magnetic field H1 is applied from the front-side of the first inclined region 12a with respect to the magnetization direction. That is, $$0<β1<90° \quad (F2)$$

Here, $β1=180°−α1−φ$ (F3).

From the above equations (F1)-(F3), the inclination angle α1 is selected to satisfy the following equation (F4):

$$90°−φ<β1<90° \quad (F4)$$

Also, the magnetic field H1 is selected to satisfy a relation of "the magnetic field H1 shown in FIG. 6A>the inversion nucleation magnetic field Hn" at the inclination angle β1 in the first inclined region 12a. In this way, the first inclined region 12a satisfies the above-mentioned magnetization inversion condition (1). As a result, an inversion nucleus is formed in the first inclined region 12a, and the magnetization of the first inclined region 12a is inverted. However, it is only the first inclined region 12a that the magnetic field is applied in the direction that the magnetization is inverted. The magnetic field H1 is applied from the rear side of the magnetization direction to the first magnetization region 11a, the magnetization invertible region 13, the second inclined region 12b and the second magnetization region 11b. That is, the magnetization inversion does not occur in the other regions. The domain walls DW are introduced into a portion between the first inclined region 12a and the magnetization invertible region 13 and a portion between the first magnetization region 11a and the first inclined region 12a. Such a state is shown in FIG. 7C.

Figure 7C:
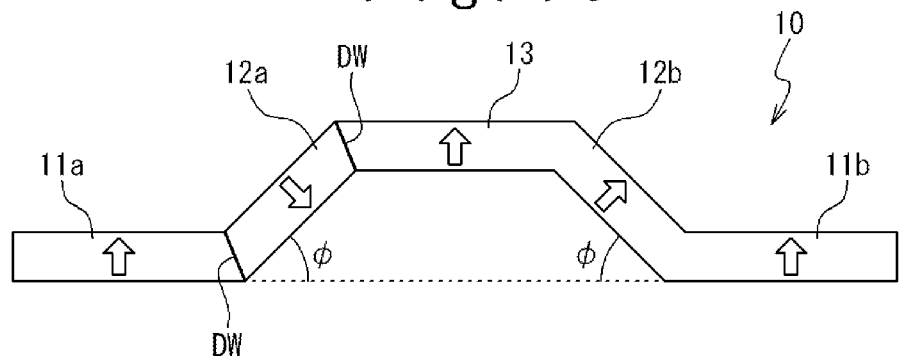
FIG. 7C is a sectional view showing the initializing method according to the embodiment of the present invention.
Figure 7D:
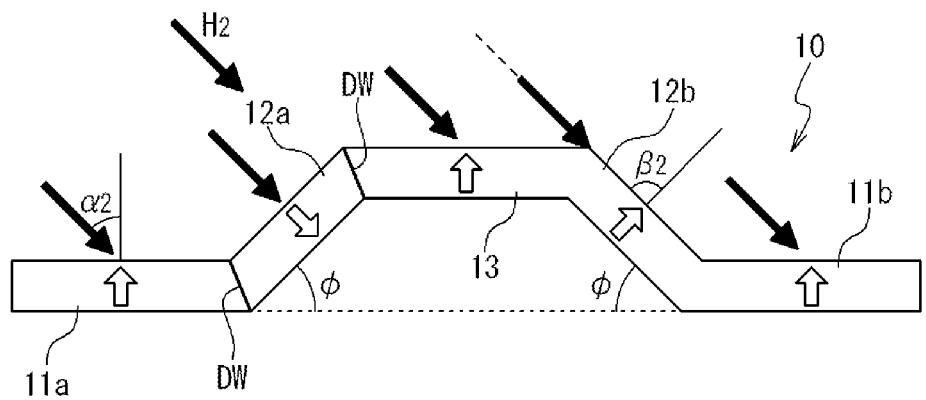
FIG. 7D is a sectional view showing the initializing method according to the embodiment of the present invention.
Figure 7E:
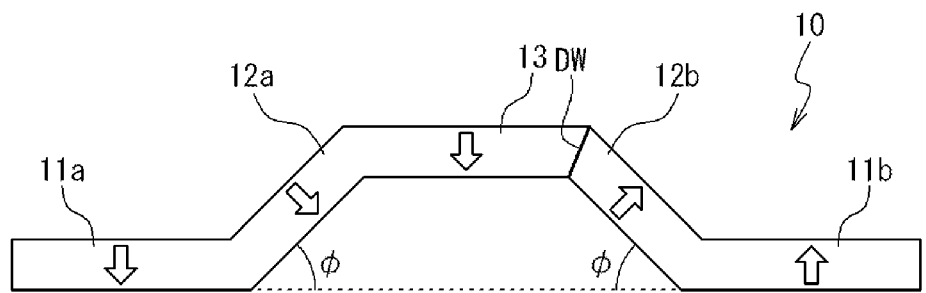
FIG. 7E is a sectional view showing the initializing method according to the embodiment of the present invention.

Next, magnetic field H2 is applied from the side of the upper surface of the magnetic record layer (the surface on the +Z side) in the state of FIG. 7C to the magnetic record layer 10, i.e. the first magnetization region 11a, the magnetization invertible region 13 and the second magnetization region 11b at the inclination angle α2 as shown in FIG. 7D (magnetic field applying step 2). The inclination angle α2 (=90°−φ) is selected in a range that the direction of the magnetic field H2 has the inclination angle α2 with respect to a direction parallel to the film of the second inclined region 12b (the inclination angle β2=90° to the second inclined region 12b). Also, the magnetic field H2 is selected to satisfy a relation of "the magnetic field H2>the domain wall motion magnetic field Hd" in the first magnetization region 11a and the magnetization invertible region 13 at the inclination angle α2 (=90°−φ) as shown in FIG. 6A. In this way, the first magnetization region 11a and the magnetization invertible region 13 satisfy the above-mentioned magnetization inversion condition (2). As a result, the magnetizations of the first magnetization region 11a and the magnetization invertible region 13 are inverted through the movement of the domain wall DW. The domain wall DW between the first magnetization region 11a and the first inclined region 12a go through the first magnetization region 11a and disappears. On the other hand, the domain wall DW between the first inclined region 12a and the magnetization invertible region 13 goes through the magnetization invertible region 13 and reaches a boundary between the magnetization invertible region 13 and the second inclined region 12b. Here, the magnetic field H2 has the inclination angle β2=90° to the second inclined region 12b and is in a range of the magnetic field which the domain wall motion cannot be performed (FIG. 6A). Therefore, the domain wall DW reaches a boundary between the magnetization invertible region 13 and the second inclined region 12b but cannot pass through the second inclined region 12b and stops there. Thus, only one domain wall DW stops at the boundary between the magnetization invertible region 13 and the second inclined region 12b. The state is shown in FIG. 7E. In this case, because the second magnetization region 11b should not be inverted as an attention point, the magnetic field H should not exceed the inversion nucleation magnetic field Hn in the second magnetization region 11b. Therefore, a relation of "the inversion nucleation magnetic field Hn shown in FIG. 6A>the magnetic field H2>the domain wall motion magnetic field Hd" is satisfied at the inclination angle α2.

From the above principle, only one domain wall DW is introduced into a domain wall layer and therefore, the initialization of the magnetic resistance element (MRAM) according to the present embodiment completes.

In the present embodiment, the initialization of the magnetic record layer 10 can be performed without using the hard layers 14a and 14b.

Here, the inclination angles φ of the first inclined region 12a and the second inclined region 12b will be described.

In a case of the above initialization, in FIG. 7B, the inclination angle β1 must satisfy a relation of 90°−φ<β1<90° (F4). Here, 0<β1<90° (F2).

Thus, the inclination angle must satisfy the following relation:

$$0° < \phi < 90° \quad (F5)$$

On the other hand, in FIG. 7D, the inclination angle α2 (=90°−φ) is necessary to satisfy a relation of "the inversion nucleation magnetic field Hn shown in FIG. 6A>the magnetic field H2>the domain wall motion magnetic field Hd". Therefore, the inclination angle α2 (=90°−φ)<θ₀ (about 75°) from FIG. 6A. Thus, the inclination angle φ is in the following range.

$$\phi > 90° - \theta_0 \quad (F6)$$

From the above equations (F5) and (F6), the inclination angle φ is in a range below:

$$90° - \theta_0 < \phi < 90° \quad (F7)$$

Here, in the manufacturing method shown in FIG. 5A to FIG. 5C, if the inclination angle φ is too large when the film for the magnetic record layer 10 of FIG. 5C is grown, it is difficult to maintain uniformity of the film thickness between the first inclined region 12a and the second inclined region 12b and each of the other regions. Therefore, it is desirable that the upper limit of the inclination angle φ is about 60° from the viewpoint of the uniformity of the film thickness. That is, the inclination angle φ is desirable to satisfy 90°−θ₀ (=about 15°)<φ<60°. More desirably, it is 20°<φ<50°.

Next, a method of writing data to the magnetic resistance device 1 will be described with reference to FIG. 4A.

The data write is performed by the domain wall motion method which uses spin transfer. A write current flows to the in-plane direction of the magnetic record layer 10. The write current is supplied to the magnetic record layer 10 through the hard layers 14a and 14b, or the current terminals 14a and 14b from the current terminal. The state in which the magnetization directions of the magnetization invertible region 13 and the reference layer 30 are parallel to each other is related to data "0". In the data "0" state, the magnetization direction of the magnetization invertible region 13 is the +Z direction and the domain wall DW exists in the boundary between the first magnetization region 11a and the first inclined region 12a. On the other hand, the state in which the magnetization directions of the magnetization invertible region 13 and the reference layer 30 are anti-parallel to each other is related to data "1" (in case of FIG. 4A). In the data "1" state, the magnetization direction of the magnetization invertible region 13 is the −Z direction and the domain wall DW exists in the boundary between the second magnetization region 11b and the second inclined region 12b.

On the other hand, in writing of the data "1", a write current is supplied from the second magnetization region 11b to the first magnetization region 11a. In this case, the spin polarized electrons are injected from the first magnetization region 11a into the first inclined region 12a, the magnetization inversion region 13, and the second inclined region 12b. The spins of the injected electrons drives the domain wall DW which is in the boundary between the first magnetization region 11a and the first inclined region 12a, to the direction of the second magnetization region 11b. As a result, the magnetization direction of the magnetization invertible region 13 is switched to the −Z direction. In other words, due to the spin transfer effect, the magnetization of the magnetization invertible region 13 is inverted and the magnetization direction is changed to the −Z direction.

On the other hand, in the writing of data "0", the write current is flows from the first magnetization region 11a to the second magnetization region 11b. In this case, the spin polarized electrons are injected from the second magnetization region 11b to the second inclined region 12b, the magnetization inversion region 13, and the first inclined region 12a. The spins of the injected electrons drives the domain wall DW present in the boundary between the second magnetization region 11b and the second inclined region 12b, to the direction of the first magnetization region 11a. As a result, the magnetization direction of the magnetization invertible region 13 is switched to the +Z direction. In other words, by the spin transfer effect, magnetization direction of the magnetization invertible region 13 is inverted and the magnetization direction is changed to the +Z direction.

At the time of read of the data, a read current is supplied to flow between the reference layer 30 and the magnetization invertible region 13. For example, the read current flows through a route from the first magnetization region 11a to the reference layer 30 through the magnetization invertible region 13 and the spacer layer 20. The resistance value of the magnetic resistance device 1 is detected based on the read current or the read voltage and the magnetization direction of the magnetization invertible region 13 is sensed.

Figure 8:
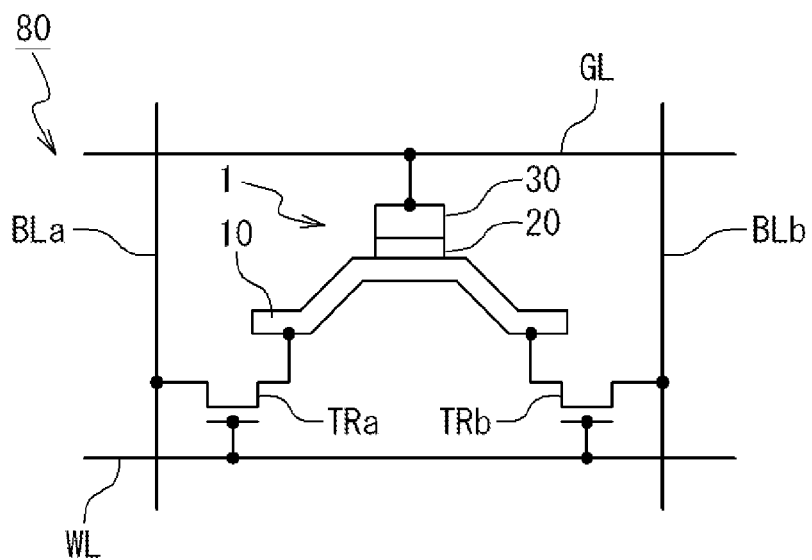
FIG. 8 is a diagram schematically showing an example of the circuit configuration of the memory cell of the MRAM according to the embodiment of the present invention.

Next, the circuit configuration of a memory cell of the MRAM according to the embodiment of the present invention will be described. FIG. 8 is a diagram schematically showing an example of the circuit configuration of the memory cell of the MRAM according to the present embodiment. In this example, the memory cell 80 contains the magnetic resistance device 1 described with reference to FIG. 4A to FIG. 7E and is connected with each of a word line WL, a ground conductor GL, and a pair of bit lines BLa and BLb. For example, a terminal connected with the reference layer 30 is connected with a ground line GL for the read operation. The terminal connected with the first magnetization region 11a is connected with one of a source and a drain of a transistor TRa and the other of the source and the drain is connected with the bit line BLa. A terminal connected with the second magnetization region 11b is connected with one of a source and a drain of a transistor TRb and the other of the source and the drain is connected with the bit line BLb. The gates of the transistors TRa and TRb are connected with a common word line WL.

In the data write, the word line WL is set to a high level and the transistors TRa and TRb are turned on. Also, either of the bit lines BLa and BLb is set to the high level and the other is set to the low level (ground level). As a result, the write current flows between the bit line BLa and the bit line BLb through the transistors TRa and TRb, and the magnetic record layer 10 of the magnetic resistance device 1. Because the write current flows between the first magnetization region 11a and the second magnetization region 11b in the magnetic record layer 10, the domain wall moves and data is written in the magnetic record layer 10.

At the time of data read, the word line WL is set to the high level and the transistors TRa and TRb are turned on. Also, the bit line BLa is set to an open state and the bit line BLb is set to the high level. As a result, the read current flow from the bit line BLb to the ground line GL through the transistors TRb and MTJ of the magnetic resistance device 1. Thus, the read operation using the magneto-resistance effect becomes possible.

Figure 9:
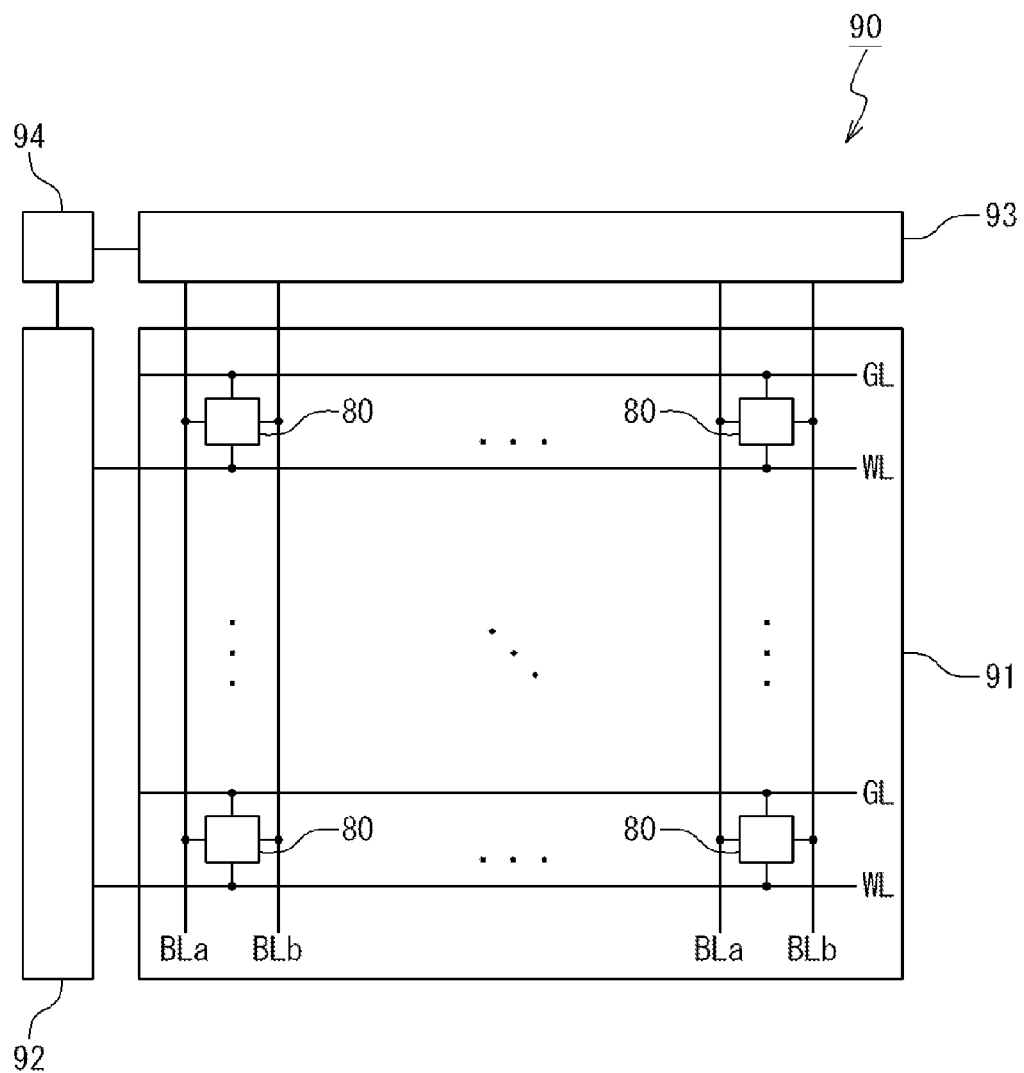
FIG. 9 is a block diagram showing an example of the configuration of the MRAM according to the embodiment of the present invention.

FIG. 9 is a block diagram showing an example of the configuration of the MRAM according to the present embodiment. The MRAM 90 is provided with a memory cell array 91, an X driver 92, a Y driver 93, and a controller 94. The memory cell array 91 includes a plurality of memory cells 80 arranged in an array. Each of the plurality of memory cells 80 is as described with reference to FIG. 8. As shown in FIG. 8, the memory cell 80 is connected with the word line WL, the ground line GL, and the bit lines BLa and BLb. The X driver 92 is connected with the plurality of word lines WL and drives one selected word line connected with the magnetic memory cell 80 as an access target, of the plurality of word lines WL. The Y driver 93 is connected with the plurality of bit lines BLa and BLb and sets each bit line to a state determined based on the data write or the data read. The controller 94 controls each of the X driver 92 and the Y driver 93 based on the data write or the data read.

Figure 10A:
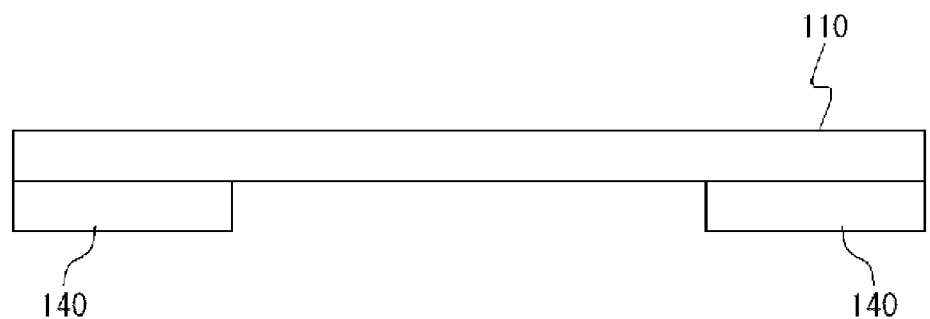
FIG. 10A is a diagram schematically showing an effect of the embodiment of the present invention.
Figure 10B:
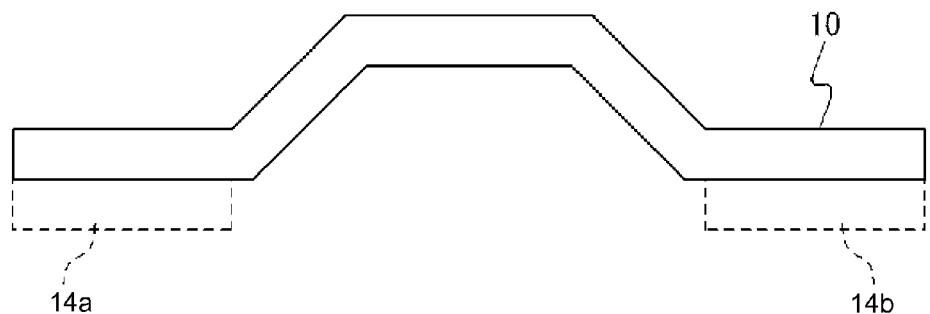
FIG. 10B is a diagram schematically showing the effect of the embodiment of the present invention.

FIG. 10A and FIG. 10B are diagrams schematically showing an effect in the present embodiment. In the conventional technique shown in FIG. 10A, hard layers 140 are jointed with the bottom of a flat magnetic record layer 110. Thus, the initialization is performed while an inversion magnetic field is controlled, by using the magnetic coupling between the magnetizations of the first and second magnetization regions and the magnetizations of the hard layers. Therefore, the problem described with reference to FIG. 2A to FIG. 3B is left.

On the other hand, in the present embodiment shown in FIG. 10B, the structure of the magnetic record layer 10 has an inclination structure (inclination region). While the inversion magnetic field is controlled by using the inclination angles of the first and second inclined regions, the initialization is performed. Therefore, the initializing method shown in FIG. 7A to FIG. 7E can be executed. In this case, the magnetic record layer 10 is provided on the hard layers 14a and 14b to which the surface exposing process is performed, but it is not necessary to use the hard layers 14a and 14b for the initializing method. Therefore, even if non-uniformity of the film thicknesses of the hard layers 14a and 14b occurs in the wafer surface, the initialization can be carried out without any influence of the non-uniformity. That is, the initialization can be uniformly carried out with no relation to a process variation of magnetic coupling of the first and second magnetization regions and the hard layers. In other the words, in this structure, irrespective of existence or non-existence of the hard layers, the initialization can be carried out. Therefore, the initialization can be uniformly carried out irrespective of the characteristic variation of the hard layer depending on the process.

The present invention is not limited to the embodiments and it would be apparent that the present invention may be appropriately modified without departing from the sprit of the present invention.

What is claimed is:

1. An initializing method of a magnetic random access memory which comprises:
    a magnetic record layer which is ferromagnetic;
    a ferromagnetic magnetization fixed layer whose magnetization is fixed; and
    a non-magnetic spacer layer provided between said magnetic record layer and said magnetization fixed layer,
    wherein said magnetic record layer comprises:
    a magnetization invertible region whose magnetization is invertible and which is connected to said magnetization fixed layer through said spacer layer;
    a first magnetization region which has a magnetization in a first direction and which is provided in parallel to said magnetization invertible region;
    a second magnetization region which has a magnetization in a second direction and which is provided in parallel to said magnetization invertible region;
    a first inclined region connected to said magnetization invertible region and said first magnetization region at a predetermined inclination angle; and
    a second inclined region connected to said magnetization invertible region and said second magnetization region at said inclination angle,
    said initializing method comprising:
    setting magnetization directions of said magnetization invertible region, said first magnetization region, said second magnetization region, said first inclined region, and said second inclined region to a same direction;
    applying a first magnetic field on a surface of said first inclined region at a first angle to invert the magnetization direction of said first inclined region; and
    applying a second magnetic field in a direction parallel to a surface of said second inclined region to invert the magnetization directions of said first magnetization region and said magnetization invertible region.

2. The initializing method according to claim 1, wherein said inclination angle is set in a range of an inclination angle of said second magnetic field to said magnetic record layer such that a value of an inversion nucleation magnetic field in said magnetic record layer is larger than a value of a domain wall motion magnetic field.

3. The initializing method according to claim 2, wherein said first angle is set in an angle range such that said first magnetic field is applied from a front side with respect to the magnetization direction of said first inclined region and from a rear side with respect to the magnetization directions of said magnetization invertible region, said first magnetization region, said second magnetization region, and said second inclined region,
    wherein said first magnetic field is set in a range of said first angle in a range of the inversion nucleation magnetic field of said first inclined region or above, and
    wherein said second magnetic field is set in a range which is smaller than the value of the inversion nucleation magnetic field of said second magnetization region and which is larger than the value of the domain wall motion magnetic field.

4. The initializing method according to claim 3, wherein said setting comprises:
    applying a magnetic field to said magnetic record layer into a direction perpendicular to a first surface from a side of the first surface of said magnetization region,
    wherein said first magnetic field is applied from a side of a second surface of said magnetization region which is opposite to the first surface, at said first angle to the surface of said first inclined region, and
    wherein said second magnetic field is applied from the side of said first surface in a direction parallel to the surface of said second inclined region.

5. The initializing method according to claim 2, wherein said first angle is set to an angle at which a direction of a perpendicular component of said first magnetic field to the surface of said first inclined region is a direction opposite to the magnetization direction of said first inclined region and the direction of the perpendicular component of said first magnetic field to surfaces of said magnetization invertible region, said first magnetization region, said second magnetization region and said second inclined region is same as the magnetization directions of said magnetization invertible region, said first magnetization region, said second magnetization region and said second inclined region,
    wherein said first magnetic field is set in a range of said first angle and in a range of the inversion nucleation magnetic field of said first inclined region or above, and wherein said second magnetic field is set in a range which is smaller than the value of the inversion nucleation magnetic field of said second magnetization region and which is larger than the value of the domain wall motion magnetic field.

6. The initializing method according to claim 4, wherein said setting comprises:
applying a magnetic field to said magnetic record layer into a direction perpendicular to a first surface from a side of the first surface of said magnetization region,
wherein said first magnetic field is applied from a side of a second surface of said magnetization region which is opposite to the first surface, at said first angle to the surface of said first inclined region, and
wherein said second magnetic field is applied from the side of said first surface in a direction parallel to the surface of said second inclined region.

7. A magnetic random access memory comprising:
a magnetic record layer which is ferromagnetic;
a ferromagnetic magnetization fixed layer whose magnetization is fixed; and
a non-magnetic spacer layer provided between said magnetic record layer and said magnetization fixed layer,
wherein said magnetic record layer comprises:
a magnetization invertible region whose magnetization is invertible and which is connected to said magnetization fixed layer through said spacer layer;
a first magnetization region which has a magnetization in a first direction and which is provided in parallel to said magnetization invertible region;
a second magnetization region which has a magnetization in a second direction and which is provided in parallel to said magnetization invertible region;
a first inclined region connected to said magnetization invertible region and said first magnetization region at a predetermined inclination angle; and
s second inclined region connected to said magnetization invertible region and said second magnetization region at said inclination angle.

8. The magnetic random access memory according to claim 7, wherein said inclination angle is set based on a range of an inclination angle of an external magnetic field to said magnetic record layer such that a value of an inversion nucleation magnetic field in said magnetic record layer is larger than a value of a domain wall motion magnetic field.

9. The magnetic random access memory according to claim 8, further comprising:
conductive layers provided on or under of ends of said magnetic record layer,
wherein said conductive layers comprise:
a first hard layer provided in a neighborhood of said first magnetization region to fixe a magnetization of said first magnetization region to said first direction; and
a second hard layer provided in a neighborhood of said second magnetization region to fixe a magnetization of said second magnetization region to said second direction.

10. The magnetic random access memory according to claim 8, further comprising:
conductive layers provided on or under of ends of said magnetic record layer,
wherein said conductive layers comprise:
a first write current terminal connected to said first magnetization region; and
a second write current terminal connected to said second magnetization region.

* * * * *